United States Patent
Sohn et al.

(10) Patent No.: US 6,879,006 B2
(45) Date of Patent: Apr. 12, 2005

(54) MOS TRANSISTOR AND METHOD FOR FABRICATING THE SAME

(75) Inventors: Yong-Sun Sohn, Ichon-shi (KR); Chang-Woo Ryoo, Ichon-shi (KR); Jeong-Youb Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/809,350

(22) Filed: Mar. 26, 2004

(65) Prior Publication Data

US 2004/0180489 A1 Sep. 16, 2004

Related U.S. Application Data

(62) Division of application No. 10/331,590, filed on Dec. 31, 2002, now Pat. No. 6,767,780.

(30) Foreign Application Priority Data

May 24, 2002 (KR) .......................................... 2002-29020

(51) Int. Cl.$^7$ ............................................. H01L 29/76
(52) U.S. Cl. ........................ 257/376; 257/349; 257/402; 438/174; 438/289
(58) Field of Search ................................. 438/173–175, 438/289–291, 302–307, 519–531; 257/349, 362, 376, 398–409

(56) References Cited

U.S. PATENT DOCUMENTS

| 5,500,379 A | * | 3/1996 | Odake et al. | ................ 438/217 |
| 5,594,264 A | * | 1/1997 | Shirahata et al. | ........... 257/335 |
| 6,469,347 B1 | * | 10/2002 | Oda et al. | .................... 257/345 |

FOREIGN PATENT DOCUMENTS

KR      2000-67076      11/2000      ........... H01L/29/78

* cited by examiner

Primary Examiner—Matthew Smith
Assistant Examiner—Calvin Lee
(74) Attorney, Agent, or Firm—Mayer, Brown, Rowe & Maw LLP

(57) ABSTRACT

A method for fabricating a CMOS transistor is disclosed. The present invention provides a method for producing a CMOS transistor having enhanced performance since a short channel characteristic and operation power can be controlled by the duplicate punch stop layer of the pMOS region and the operation power of the nMOS is also controlled by dopant concentration of the duplicated LDD region combined by the first LDD region and the second LDD region.

13 Claims, 13 Drawing Sheets

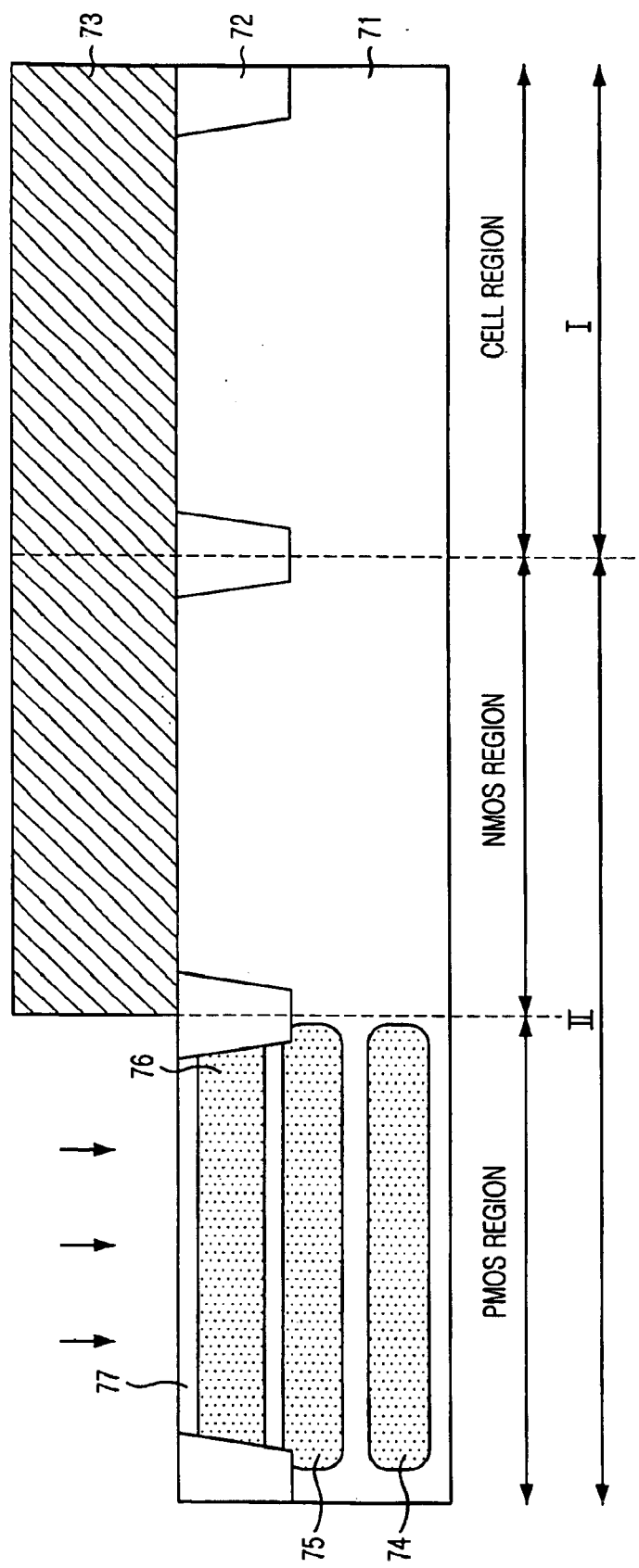

MOS TRANSISTOR AND METHOD FOR FABRICATING THE SAME

This application is a divisional of U.S. application Ser. No. 10/331,590, filed Dec. 31, 2002 and issued as U.S. Pat. No. 6,767,780.

FIELD OF THE INVENTION

The present invention relates to a method for fabricating a semiconductor memory device; and, more particularly, to a method for fabricating a CMOS transistor.

DESCRIPTION OF RELATED ARTS

A complementary metal oxide semiconductor (CMOS) transistor includes a nMOS transistor and a pMOS transistor. If the CMOS transistor is used for configuring a peripheral circuit of a memory device of 0.18 $\mu$m and below, the COMS transistor includes the 0.25 $\mu$m and larger nMOS and pMOS transistors having a gate length larger than a minimum line width. The above mentioned CMOS transistor is configured by concurrently forming a lightly doped drain (LDD) region of a surface channel nMOS transistor and a punch stop layer of a buried channel pMOS transistor. The LDD region and the punch stop layer is formed by ion implantation of an n-type dopant such as phosphorus (P) into a forming region of the nMOS transistor and a forming region of the pMOS transistor without using a mask.

FIGS. 1A to 1B are cross-sectional views showing a conventional process for fabricating a CMOS transistor.

Referring to FIG. 1A, after forming a device isolation layer for isolating each of devices in a semiconductor substrate 11, a n-type well 13 is formed on a region of a pMOS transistor in the semiconductor substrate 11 and continuously an n-type field stop layer 14 is formed in the n-type well 13. A p-type well 15 is formed on a nMOS transistor region in the semiconductor substrate 11 and a p-type field stop layer 16 is formed on the p-type well 15.

After forming the p-type field stop layer 16, a gate oxide layer 17 and a gate electrode 18 is formed on a selected region on the semiconductor substrate 11 providing the pMOS transistor and nMOS transistor. Finally, there formed an n-type punch stop layer 20 on the pMOS transistor and an n-type LDD 21 on the nMOS transistor by ion-implanting phosphorus (P) by using a blanket ion implantation and depositing a nitride layer 19 on the above entire structure.

Referring to FIG. 1B, after an oxide layer (not shown) is deposited on the entire structure, a spacer 22 contacting to lateral sides of the gate electrode 18 is formed by an etch-back process. At this time, the nitride layer 19 and the gate oxide layer 17 are concurrently proceeded with an etch-back process applied to an upper surface of the semiconductor substrate 11. Reference numerals 19A and 17A are a remaining nitride layer and a remaining gate oxide layer, respectively.

Next, a p-type source/drain region 23 is formed by ion-implanting a p-type impurity in the pMOS transistor region, and an n-type source/drain region 24 is also formed by ion-implanting an n-type impurity on the nMOS transistor region.

In FIGS. 1A and 1B, when the n-type LDD doping layer 21 is formed on the nMOS transistor region, the n-type punch stop layer 20 is also formed on the pMOS transistor region.

However, in the above mentioned conventional method for fabricating the CMOS transistor, optimum characteristics of the nMOS transistor and the pMOS transistor cannot be obtained, since forming conditions for the LDD region of the nMOS transistor and the punch stop layer of the pMOS transistor are identical. As a result, one of the characteristics of the nMOS transistor and the pMOS transistor is degraded.

Furthermore, the above mentioned conventional method cannot control a short channel effect provided by each of the nMOS transistor and the pMOS transistor since a gate length of a peripheral circuit is below 0.25 $\mu$m in the memory device of above 0.15 $\mu$m.

For example, when the n-type impurity is ion-implanted for concurrently forming the LDD region and the punch stop layer, the short channel effect of the pMOS transistor is constrained according to an amount of the n-type impurity for ion-implantation, however, the short channel characteristic of the nMOS transistor is degraded. Also, when the n-type impurity is ion-implanted with a minimally increased quantity for increasing driving current of the nMOS transistor, a threshold voltage $V_T$ is dynamically increased and the driving current is decreased. Therefore, reducing the gate length of the MOS transistor provides a limitation in a fabricating process for the CMOS transistor.

For overcoming the above mentioned problem, another conventional CMOS transistor fabricating method is introduced by Takashi Hori et al., at "A 0.1 $\mu$m CMOS technology with tilt-implanted punch through stopper (TIPS)" IEDM, 1994 (hereinafter Takashi). The Takashi teaches a method for fabricating a CMOS transistor having a gate length around 0.1 $\mu$m. The Takashi's method individually performs ion-implantations to form the punch stop structure of a surface channel nMOS transistor and a buried channel pMOS transistor by using different masks.

FIG. 2 is a cross-sectional view of a CMOS transistor for explaining the Takashi's forming process of a CMOS transistor.

Referring to FIG. 2, a gate oxide layer 25 and a gate electrode 26 are formed on a semiconductor substrate 24, and a spacer 27 is formed on both lateral sides of the gate electrode 26. A LDD region 28 is formed at edges on both sides of the gate electrode 26 in the nMOS transistor region. An n$^+$ source/drain region is formed by contacting to the LDD region 28, and the p-type punch stop layer 30 is formed on a bottom of the LDD region 28 by performing the tilted ion implantation of boron (B). In the pMOS transistor region, a p$^+$ source/drain region 31 is formed and an n-type punch stop layer 32 is formed on a side of the p$^+$ source/drain region 31 by tilted ion implanting phosphorus (P).

Atsuki Hori et al. introduces another method for fabricating a CMOS transistor in "A 0.05 $\mu$m CMOS with ultra shallow source/drain junctions fabricated by 5 KeV ion imimplantation and rapid thermal annealing" IEDM, 1994 (Hereinafter Atsuki). The Atsuki's method teaches to fabricate the nMOS transistor and the pMOS transistor in order to have a gate of 0.5 nm by using a self aligned pocket implantation (SPI) and a source/drain extension (SDE).

FIG. 3 is a cross-sectional view of a CMOS transistor for explaining the Atsuki's forming process.

Referring to FIG. 3, a gate oxide layer 34 and a gate electrode 35 are formed on a semiconductor substrate 33. Also, a spacer 36 is formed on both lateral sides of the gate electrode 35. An n$^+$ source/drain extension region 37A is formed on both edges of the gate electrode 35 in the nMOS transistor region. An n$^+$ source/drain region 38A is formed by contacting to the n$^+$ source/drain extension region 37A. A p-type self aligned pocket layer is formed beneath of the n$^+$ source/drain extension region 37A by tilted ion-implanting boron (B). An n-type self aligned pocket layer 39B and a p+ source/drain extension region 37B are formed on both edges of the gate electrode 35 in the pMOS transistor region. A p+ source/drain region 38B is formed by contacting- to the p+ source/drain extension region 37B and the n-type self aligned pocket layer 39B.

As mentioned above, the Atsuki and Takasi provide methods that optimize characteristics of the nMOS transistor and the pMOS transistor. However, the methods use different masks for each of nMOS transistor region and pMOS transistor region. Additional processes such as a LDD doping process and a source/drain extension region process are performed. As a result, a complexity of a fabricating process is increased and a manufacture expense is also increased. Therefore, the above mentioned methods are incongruent for manufacturing a semiconductor memory device.

Specially, in case of the Atuski' method, arsenic (AS) is used for forming the source/drain extension region of the nMOS transistor. As a result, a problem with respect to a hot carrier is arose when the nMOS transistor is used in one of peripheral circuits, which require a higher driving voltage such as an external voltage.

Therefore, it has been demanded that a simple and low cost method for fabricating a CMOS transistor in order to be implemented to a semiconductor device of 0.15 µm, wherein the method can maintain optimum characteristics of the nMOS transistor and pMOS transistor and prevent the hot carrier problem.

SUMMARY OF THE INVENTION

It is, therefore, an object of the present invention to provide a simple and low cost method for fabricating a CMOS transistor in order to constrain a short channel effect and a hot carrier effect.

In accordance with an aspect of the present invention, there is provided a semiconductor, comprising a gate electrode and a gate oxide layer on a semiconductor substrate; spacers formed on sides of the layer; a first conductive type source/drain region formed at edge of the spacers in the semiconductor substrate; a second conductive type punch stop layer formed in a region between the first conductive type source/drain region in the semiconductor substrate; a first conductive type source/drain extension region occupying a extended region from the first conductive type source/drain region to the both edges of the gate electrode; and a first conductive type lightly doped drain (LDD) region being adjoined to the source/drain region and surrounding the source/drain extension region, wherein the junction depth of the first conductive type LDD region is constrained by the punch stop layer.

In accordance with another aspect of the present invention, there is also provided a semiconductor device, comprising: a semiconductor substrate having a nMOS region and a pMOS region; a gate electrode and a gate oxide layer formed on each of the nMOS region and the pMOS region; spacers contacted to sides of the layer; a p-type source/drain region formed in the pMOS region by lining up at edges of the spacers; a n-type source/drain region formed in the nMOS region by lining up at edges of the spacers; a first punch stop layer formed by overlapped on bottom of the p-type source/drain region; a second punch stop layer formed by contacting to one side of the p-type source/drain region and on the bottom of the spacers; a third punch stop layer formed by contacting to one side of the n-type source/drain region; a source/drain extension region formed by contacting to one side of the n-type source/drain region and on bottom of the spacers; and a lightly doped drain (LDD) region surrounding the source/drain extension region.

In accordance with still another aspect of the present invention, there is also provided A method for fabricating a CMOS transistor, comprising: a) forming a n-type well region in a semiconductor substrate; b) forming a first n-type punch stop layer in the n-type well; c) forming a p-type well region in the n-type well region; d) concurrently forming a first n-type LDD region in the p-type well region and a second n-type punch stop layer in the n-type well region by ion-implanting an impurity to the gate electrode as a mask; e) forming a n-type source/drain extension region having higher concentration of the impurity than the first LDD region in the first LDD regions; f) forming a second n-type LDD region, which surrounds the n-type source/drain extension region; g) forming a spacer at a side of the gate electrode; h) forming p-type source/drain region contacting to the first punch stop layer and the second punch stop layer; and i) forming a n-type source/drain region contacting to the source/drain extension region and the first and second LLD region.

BRIEF DESCRIPTION OF THE DRAWING(S)

The above and other objects and features of the present invention will become apparent from the following description of the preferred embodiments given in conjunction with the accompanying drawings, in which:

FIGS. 6A to 6G are cross-sectional views showing a method for fabricating a CMOS transistor in accordance with another preferred embodiment of the present invention.

DETAILED DESCRIPTION OF THE INVENTION

Figure 1A:
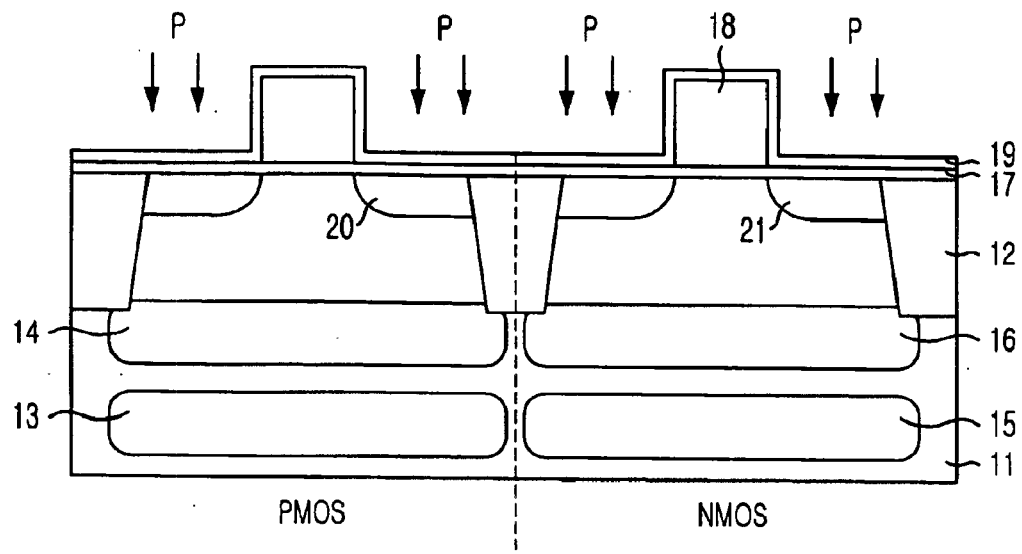
FIGS. 1A to 1B are cross-sectional views showing a conventional process for fabricating a CMOS transistor.
Figure 1B:
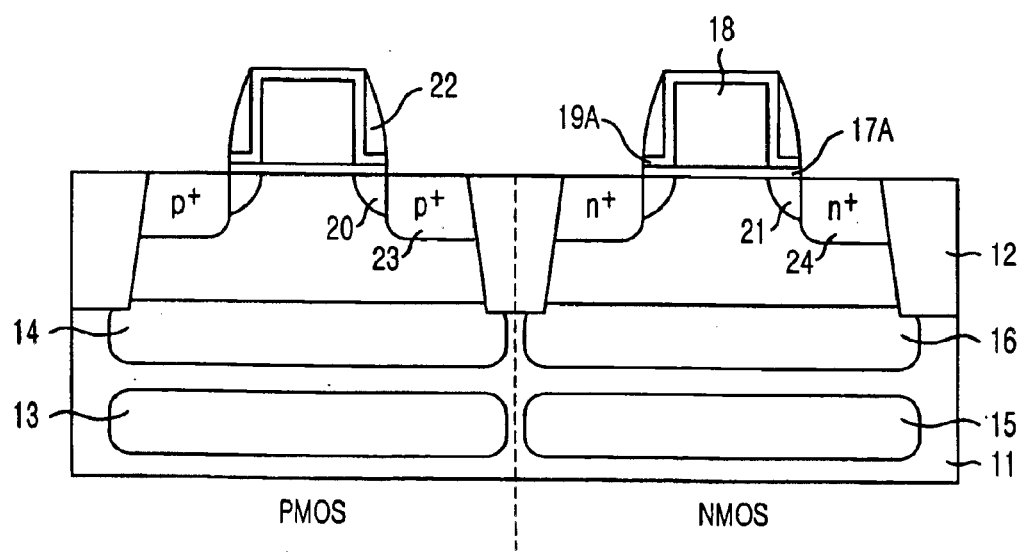
Figure 2:
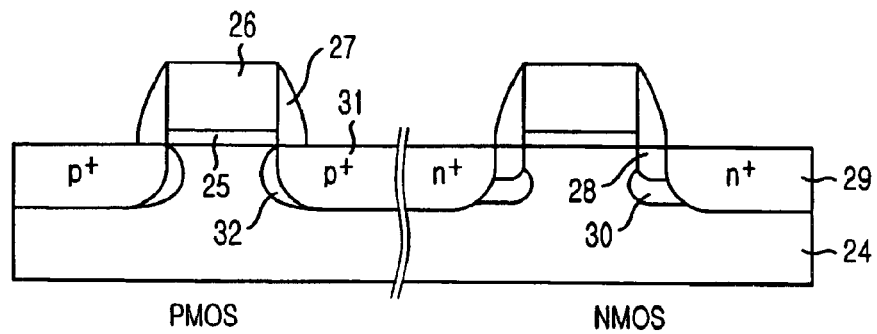
FIG. 2 is a cross-sectional view of a CMOS transistor for explaining the Takashi's forming process of a CMOS transistor.
Figure 3:
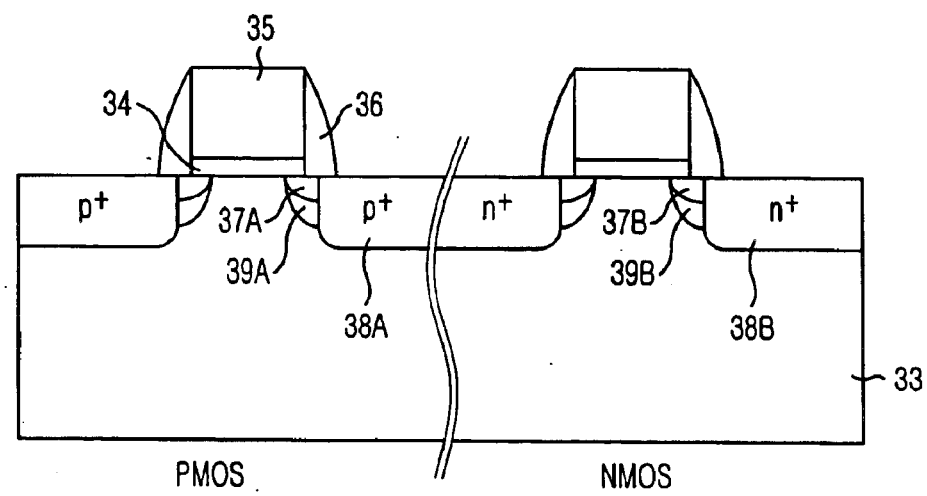
FIG. 3 is a sectional view of a CMOS transistor for explaining the Atsuki's forming process.
Figure 4:
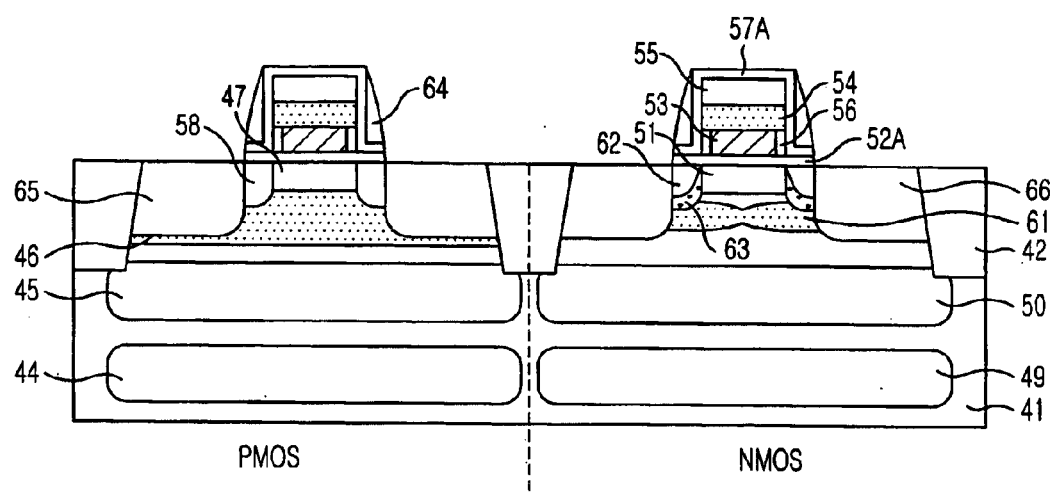
FIG. 4 is a cross-sectional view of a CMOS transistor in accordance with a preferred embodiment of the present invention.

FIG. 4 is a cross-sectional view of a CMOS transistor in accordance with a preferred embodiment of the present invention.

Referring to FIG. 4, a gate oxide layer 52A is formed on an nMOS region and a pMOS region of a semiconductor substrate 41, and a gate pattern is formed on the gate oxide layer 52A by orderly stacking a poly-silicon layer 53, a metal layer 54 and a hard mask 55. A lateral oxide 56 is formed at a lateral side of the poly-silicon layer 53, and a nitride spacer 57A is formed around of the gate pattern and contacted to the gate oxide layer 52A. An oxide spacer 64 is formed at both sides of the nitride spacer 57A. A p+ source/drain region 65 in the pMOS region and an n+ source/drain region 66 in the nMOS region are formed by being aligned at edges of the oxide spacer 64. A first n-type punch stop layer 46 is formed below of a bottom portion of the p+ source/drain region 65 by being piled up one on another, and a second n-type punch stop layer 58 is formed on a side of the p⁺ source/drain region 65. A p-type punch stop layer 61 is formed on a side of the n⁺ source/drain region 66.

An n⁺ source/drain extension region 62 is formed by contacting to a side of the n⁺ source/drain region 66 and extending to an edge of the gate pattern. A second LDD region 63 surrounds the n⁺ source/drain extension region 62.

As shown in FIG. 4, the second LDD region 63 has a multilayer structure by being a number of times doped with same impurity. The n⁺ source/drain extension region 62 and the second LDD region 63 are an identical impurity doping layer of electric conductor and have different extension rates. The second LDD region 63 is more quickly extended than the n⁺ source/drain extension region 62. The n⁺ source/drain extension region 62 is a doping layer of arsenic (AS) and the second LDD region 63 is a doping layer of phosphorus (P). An impurity concentration of the second LDD region 63 is comparatively lower than the impurity concentrations of the n⁺ source/drain region 66 and the n+ source/drain extension region 62.

FIGS. 5A to 5F are cross-sectional views of a CMOS transistor for explaining a method for fabricating the CMOS transistor in accordance with a preferred embodiment of the present invention.

Figure 5A:
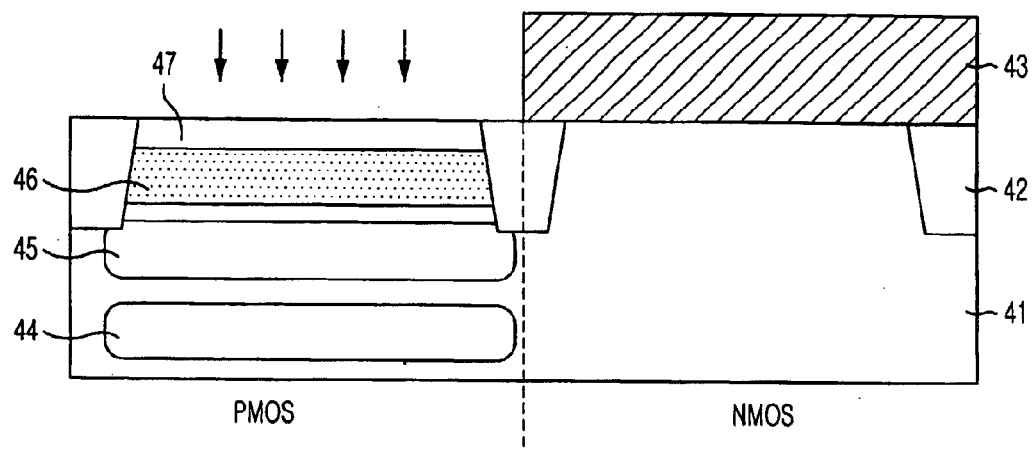
FIGS. 5A to 5F are cross-sectional views of a CMOS transistor for explaining a method for fabricating the CMOS transistor in accordance with a preferred embodiment of the present invention.

As shown in FIG. 5A, a device isolation layer 43 is formed on a semiconductor substrate 41. Either a local oxidation of silicon (LOCOS) technique or a shallow trench isolation (STI) technique is used for forming the device isolation layer 43.

After forming the device isolation layer 43, a first mask 43 is formed. The first mask 43 opens a pMOS region by coating a photosensitive film on the semiconductor substrate 41 and patterning the photosensitive film through a photo-exposure and a developing processes. After forming the first mask 43, an n-type well 44 and an n-type p-channel filed stop layer 45 are sequentially formed by ion-implanting phosphorous (P) on the pMOS region. The phosphorous is an n-type impurity.

Next, a first n-type punch stop layer 46 is formed on the pMOS region by ion-implating the n-type impurity, which is a heavy ion species such as arsenic (AS) or antimony (Sb), in a bottom of a channel forming region of the pMOS region. After forming the first n-type punch stop layer 46, a p-type p-channel ion-implantation layer 47 is formed below of the semiconductor substrate 41 by ion implanting a p-type impurity for controlling a threshold voltage of the pMOS transistor.

A depth of ion-implantation for the n-type well 44 is the deepest and depths of ion-implantation are shallower in order of the n-type p channel field stop layer 45, the first n-type punch stop layer 46 and the p-type p channel ion implantation layer 47.

Figure 5B:
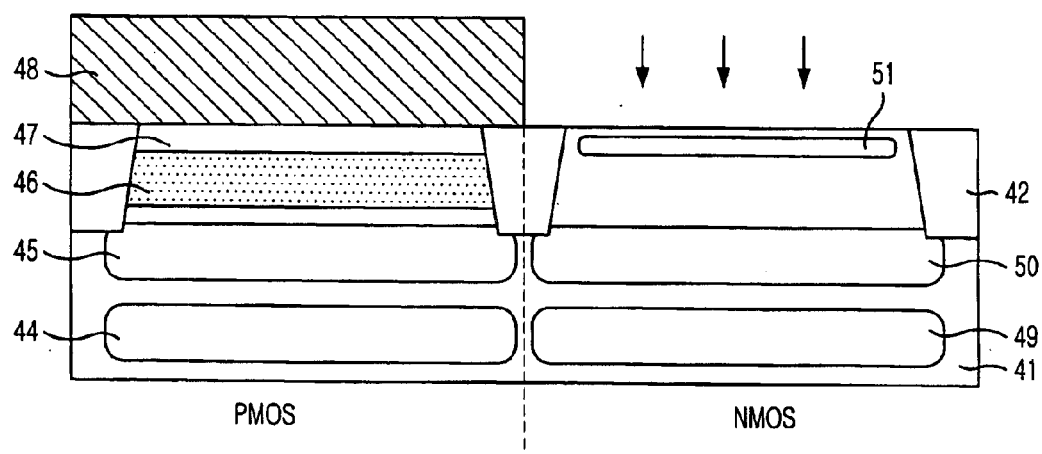

As shown in FIG. 5B, after eliminating the first mask 43, a second mask 48 is formed for opening a nMOS region by coating a photosensitive film on the semiconductor substrate 41 except for the pMOS region and patterning the photosensitive film through a photo-exposure and a developing processes.

Next, a p-type impurity is ion-implanted to the opened nMOS region by using the second mask 48 for forming a p-type well 49 and a p-type n-channel field stop layer 50 in order. After forming the p-type n-channel field stop layer 50, a p-type n-channel ion implantation layer 51 is formed near by on a surface of the semiconductor substrate 41 by ion-implanting the p-type impurity in order to control a threshold voltage of the nMOS transistor. The depth of ion-implantation for the p-type well 49 is the deepest and the depth of ion-implantation gets shallower in order of the p-type n channel field stop layer 50 and the p-type n channel ion implantation layer 51.

Figure 5C:
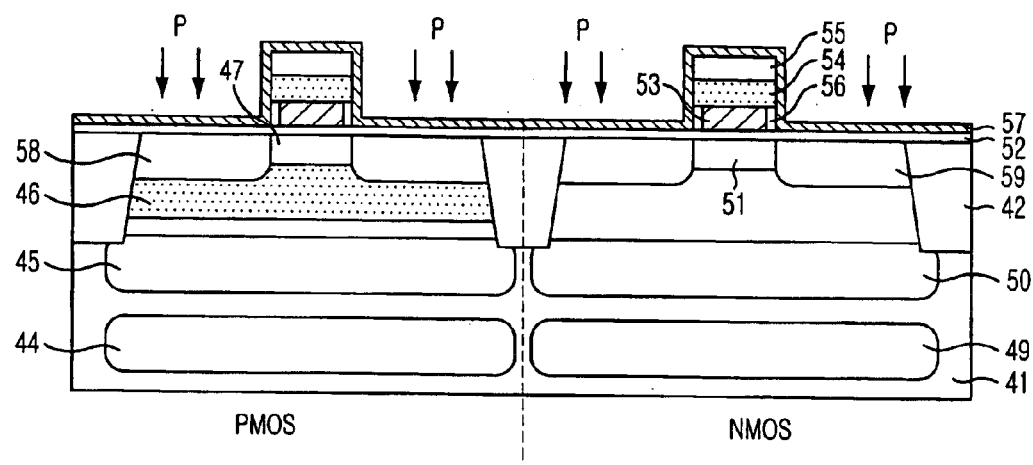

As shown in FIG. 5C, after eliminating the second mask 48, a gate oxide layer 52 is formed on the semiconductor substrate 41. Above the gate oxide layer 52, a poly-silicon layer 53, a metal layer 54 and a hard mask 55 is orderly stacked.

Next, the hard mask 55, the metal layer 54 and the poly-silicon layer 53 are concurrently patterned by using a gate mask (not shown) or after the hard mask 55 is patterned first, the metal layer 54 and the poly-silicon layer 53 are simultaneously formed.

A gate electrode of the poly-silicon layer 53 and the metal layer 54 can be a single layer of the poly-silicon layer, however a stacking layer of a poly-silicon layer and a metal layer is used for high-speed operation and resistivity of the electrode. A diffusion barrier layer, a stack layer of tungsten (W), e.g., WN/W or TiN/W and a tungsten silicide are used as the metal layer 54.

Next, a gate re-oxidation process is performed for recovering the gate oxide layer 52 damaged by etching process for the gate pattern. After the gate re-oxidation process, an oxide (Hereinafter lateral oxide) is formed on both lateral sides of the poly-silicon layer 53 since the lateral sides of the poly-silicon layer 53 are oxidized.

The gate re-oxidation process recovers a microtrench and loss of the gate oxide layer 54 when etching the gate pattern and oxidizes etch-remnants remained on a surface of the gate oxide layer 54. Also, a thickness of the gate oxide layer 54 at edges of the gate pattern is increased in order to increase reliability.

After the gate re-oxidation process, a nitride layer 57 is deposited on an entire surface. The nitride layer 57 and lateral oxide 56 construct an offset spacer.

Next, a second n-type punch stop layer 58 is formed on a pMOS region, and a first LDD region 59 is concurrently formed by ion-implanting an n-type impurity (P) on an entire surface of the nitride layer 57 without a masking process.

Figure 5D:
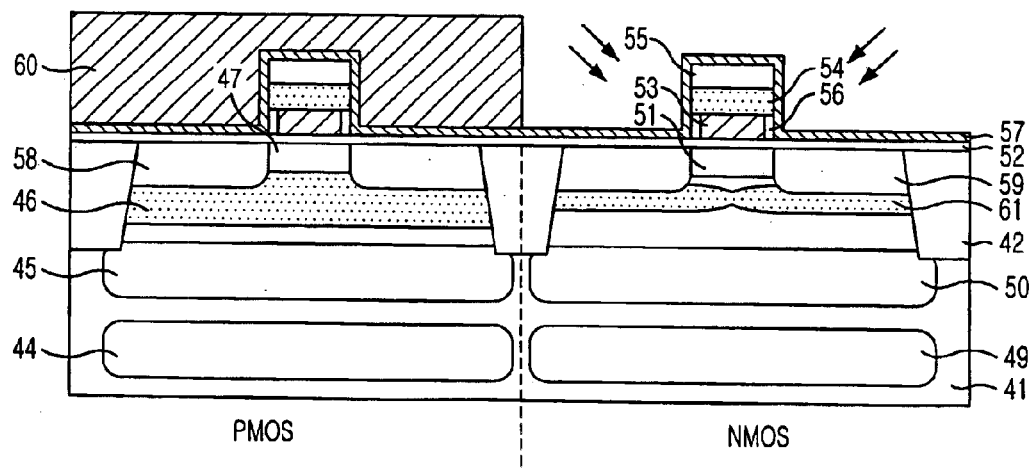

As shown in FIG. 5D, a third mask 60 is formed by coating a photosensitive film on an entire surface of the above structure on which phosphorous is ion-implanted and patterning the photosensitive film through a photo-exposure and a developing processes. The third mask 60 opens the nMOS region and closes the pMOS region. After forming the third mask 60, a p-type punch stop layer 61 of the nMOS transistor is formed by the p-type impurity implanted with a tilt angle onto the nMOS region exposed by the third mask 60. The p-type punch stop layer 61 is located beneath of the first LDD region 59.

Figure 5E:
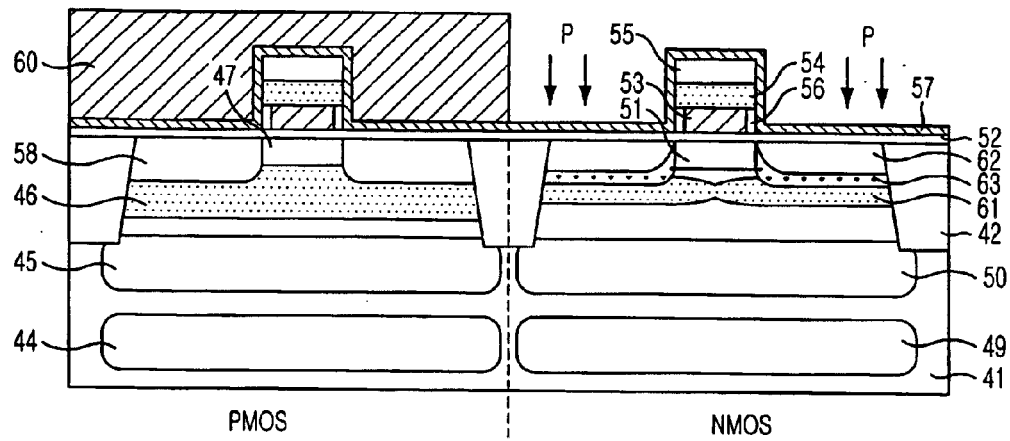

Referring to FIG. 5E, an n⁺ source/drain extension region 62 is formed by ion-implanting a high concentration of arsenic (AS) without eliminating the third mask 60. A second LDD region 63 is formed by ion-implanting phosphorous (P).

A depth of the second LDD region 63 is same or shallower than the first LDD region. 59 and deeper than n⁺ source/drain extension region 62. Impurity concentrations of the first and second LDD regions are low.

Since the first LDD region 59 and the second LDD region 63 are identical, an explanation of the first LDD region 59 is omitted here and an explanation of the second LDD 63 is in below.

Finally, the second LDD region 63 has a configuration surrounding the n⁺ source/drain extension region 62.

In a meantime, the phosphorous is ion-implanted with an implantation angle of 90° or a low angle of inclination from 0° to 15° in bi-directions or multiple implantation directions. It is also possible to ion-implant the phosphorus by combing the above two approaches.

Figure 5F:
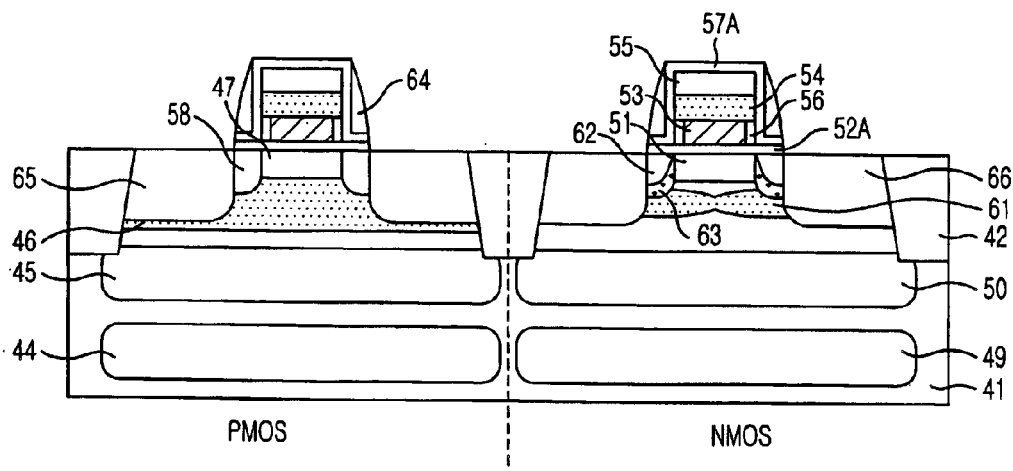

Referring to FIG. 5F, after eliminating the third mask 60, an oxide layer is deposited on an entire surface. An oxide spacer 64 is formed on the entire surface by etching the surface. At this time, a nitride layer and a gate oxide layer are concurrently etched and remained as a nitride layer spacer 57A and a gate oxide layer 52A.

Next, a source/drain region is formed by using anther masks on each of the transistor regions. For example, a p⁺ source/drain region 65 is formed by ion-implanting a high concentration of p-type impurity and a n⁺ source/drain region 66 is formed on the nMOS region by ion-implanting a high concentration of n-type impurity.

FIGS. 6A to 6G are cross-sectional views showing a method for fabricating a CMOS transistor in accordance with another preferred embodiment of the present invention. FIGS. 6A to 6G also show that an nMOS transistor is formed on a cell region I in case that a DRAM and a CMOS transistor is formed on a peripheral circuit II.

Hereinafter, a region of the nMOS transistor in the cell region I is referred as to cell region. A region of a pMOS transistor in the peripheral circuit II is referred as to pMOS region and a region of the nMOS transistor in the peripheral circuit II is referred as to an nMOS region.

Referring to FIG. 6A, the cell region I and the peripheral circuit unit II are isolated on a semiconductor substrate 71, in which the cell region I and the peripheral circuit unit II is defined. A device isolation layer 72 is formed for isolating each unit device. A LOCOS method and a STI method can be used for forming the device isolation layer 72.

Next, a photosensitive film is coated on the semiconductor substrate 71 and patterned with a photo-exposure and a developing processes for forming a first mask 73 exposing the pMOS region in the peripheral circuit unit II. After forming the first mask 73, an n-type well 74, a n-type p-channel field stop layer 75 are formed by ion-implanting phosphorus (P), which is an n-type impurity.

An n-type impurity such as heavy ion species, e.g., arsenic (AS) and antimony (Sb), are ion-implanted to the pMOS region for forming a first n-type punch stop layer 76. After forming the first n-type punch stop layer 76, a p-type p-channel ion implantation layer 77 is formed under a surface of the semiconductor substrate 71 by ion-implanting the p-type impurity for controlling a threshold voltage of the pMOS transistor.

A depth of ion-implantation of the n-type well 74 is the deepest and the depth of ion-implantation gets shorter in order of the n-type p channel field stop layer 75, the first n-type punch stop layer 76 and the p-type p-channel ion-implantation layer 77.

Figure 6B:
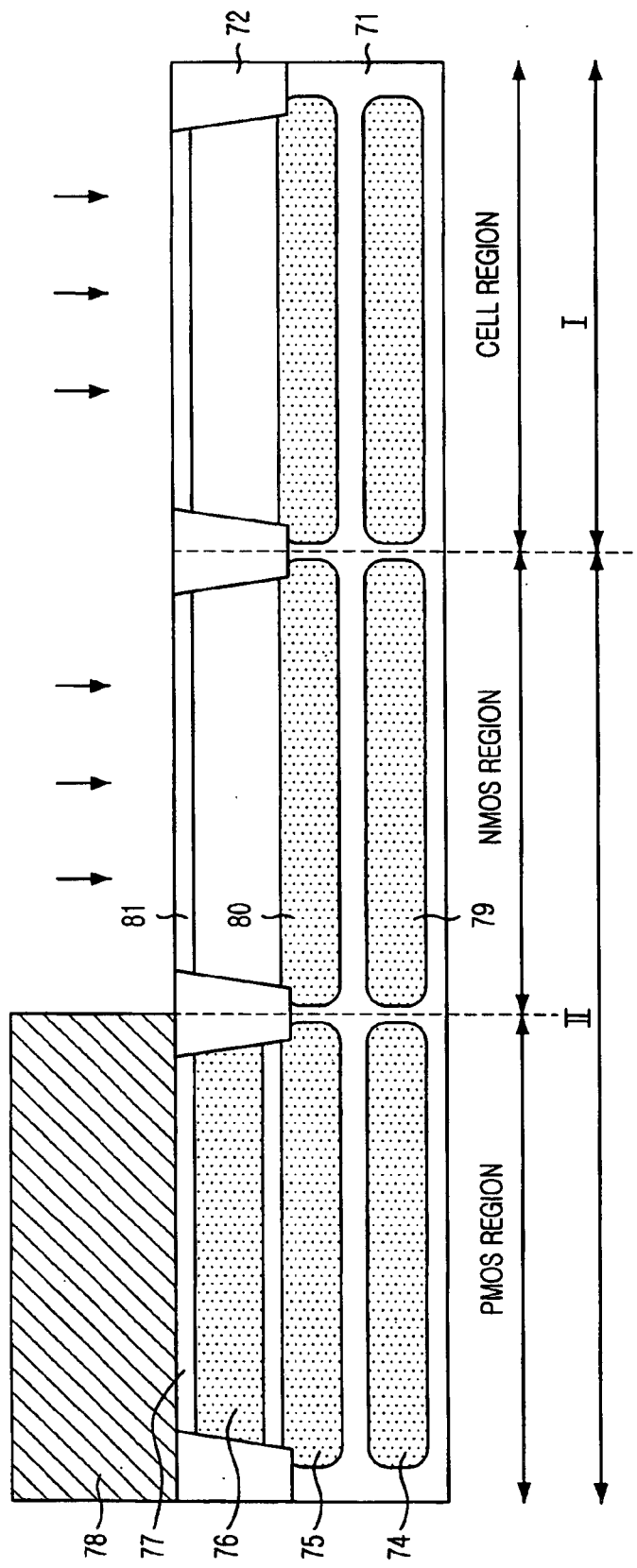

Referring to FIG. 6B, after eliminating the first mask 73, a second mask 78 is formed on the semiconductor substrate 71 except for the pMOS region by coating a photosensitive film and patterning the photosensitive film through a photo-exposure and a developing process. That is, the second mask 78 exposes the cell region I and the nMOS region of the peripheral circuit unit II.

Next, a p well 79 and a p-type n-channel field stop layer 80 are formed by ion-implanting the p-type impurity at the cell region I and the nMOS region, which is exposed by the second mask 78. A p-type n-channel ion implantation layer 81 is formed by ion-implanting the p-type impurity for controlling a threshold voltage of the nMOS transistor. A depth of ion-implantation of the p-type well 79 is the deepest and the depth of ion-implantation gets shorter in order of the p-type n-channel field stop layer 80 and the p-type n-channel ion-implantation layer 81.

Figure 6C:
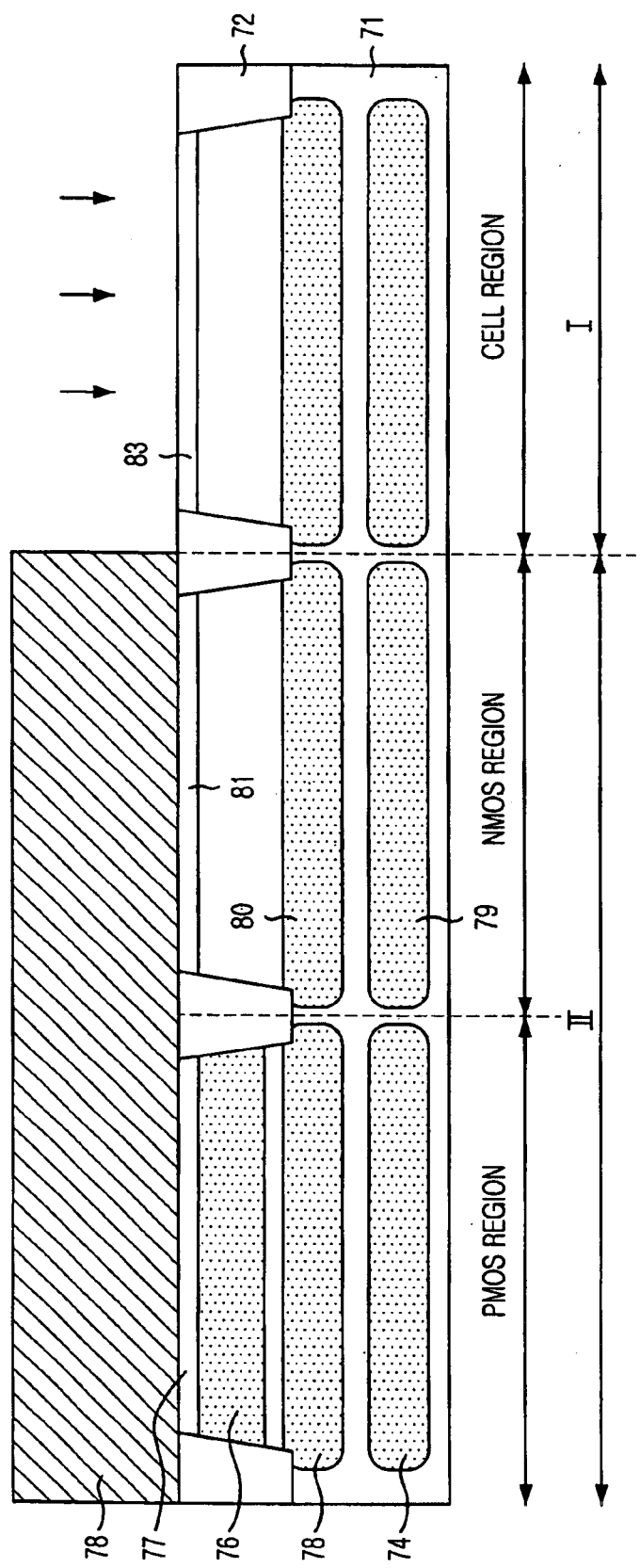

As shown in FIG. 6C, after eliminating the second mask 78, the third mask 82 is formed by coating a photosensitive film and patterning the photosensitive film through a photo-exposure and a developing processes. The third mask 82 exposes the cell region I. After forming the third mask 82, a threshold voltage control layer 83 is formed by ion-implanting the p-type impurity to an exposed cell region I for controlling threshold voltage of a cell transistor.

Figure 6D:
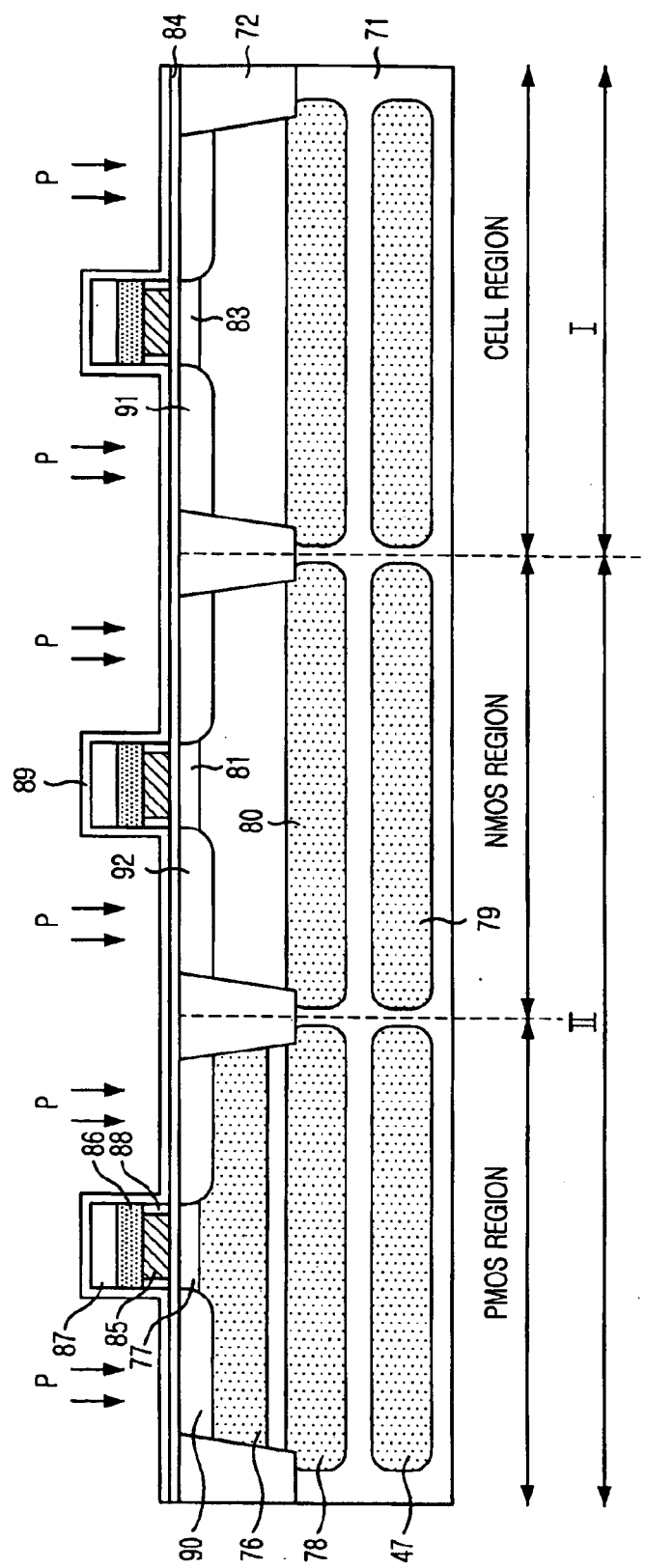

Referring to FIG. 6D, after eliminating the third mask 82, a gate oxide layer 84 is formed on the semiconductor substrate 71. A poly-silicon layer 85, a metal layer 86 and a hard mask 87 are stacked on the gate oxide layer 84.

A gate pattern is formed by stacking in order of the poly-silicon layer 85, the metal layer 86 and the hard mask 87. The poly-silicon layer 85, the metal layer 86 and the hard mask 87 are concurrently patterned by using a gate mask (not shown), or the hard mask 87 is patterned at first and the poly-silicon layer 85 and the metal layer 86 are concurrently patterned.

A gate electrode including the poly-silicon layer 83 and the metal layer 84 can be a single layer of the poly-silicon layer; however, a stacking layer of a poly-silicon layer and a metal layer is used for high-speed operation and low-resistance of the electrode. A diffusion barrier layer and a stacked layer of tungsten, e.g., WN/W or TiN/W and a tungsten silicide are used as the metal layer.

Next, a gate re-oxidation process is performed for recovering the gate oxide layer 84 damaged by etching process for the gate pattern. After the gate-reoxidation process, an oxide (Hereinafter lateral oxide) is formed on both lateral sides of the poly-silicon layer 83 since the lateral sides of the poly-silicon layer 83 are oxidized.

The gate re-oxidation process recovers a microtrench and loss of the gate oxide layer 84 when etching the gate pattern and oxidizes etching-remnants remained on a surface of the gate oxide layer 84. Also, a thickness of the gate oxide layer 84 at edges of the gate pattern is increased in order to improve reliability.

After the gate re-oxidation process, a nitride layer 89 is deposited on an entire surface. The nitride layer 89 and lateral oxide 88 construct a first offset spacer.

Next, a second n-type punch stop layer 90 is formed on a pMOS region of the peripheral circuit unit II and a first LDD region 92 on the nMOS region in the peripheral circuit unit II and a LDD region 91 of the cell transistor are concurrently formed by ion-implanting a n-type impurity, e.g., phosphorus, on an entire surface of the nitride layer 89 without a masking process.

Figure 6E:
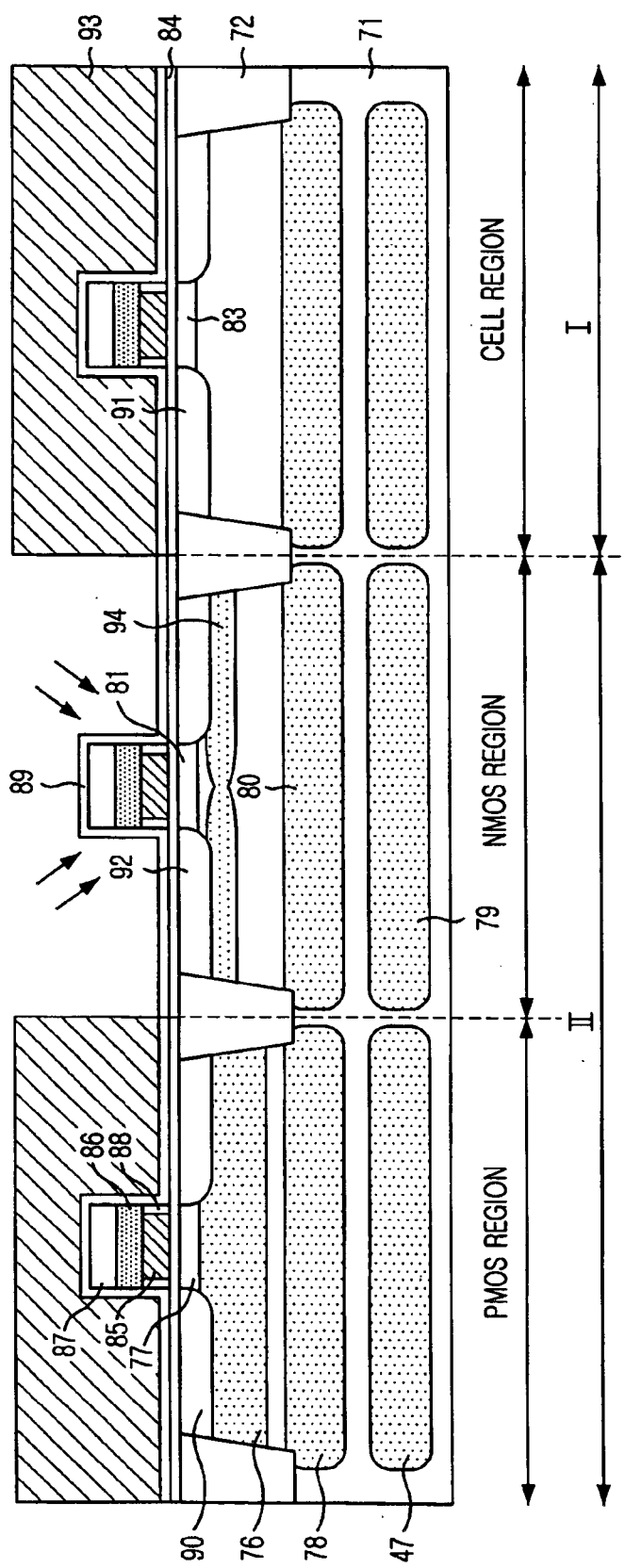

As shown in FIG. 6E, a fourth mask 93 is formed by coating a photosensitive film on an entire surface of above structure where the phosphorous is implanted and patterning the photosensitive film through a photo-exposure process and a developing process. The fourth mask opens the nMOS region of the peripheral circuit unit II and closes the pMOS region and the cell transistor region. After forming the fourth mask 93, a p-type punch stop layer 94 of the nMOS transistor by the p-type impurity implanted with tilted angled. The p-type punch stop layer 94 is located beneath of the first LDD region 92.

Figure 6F:
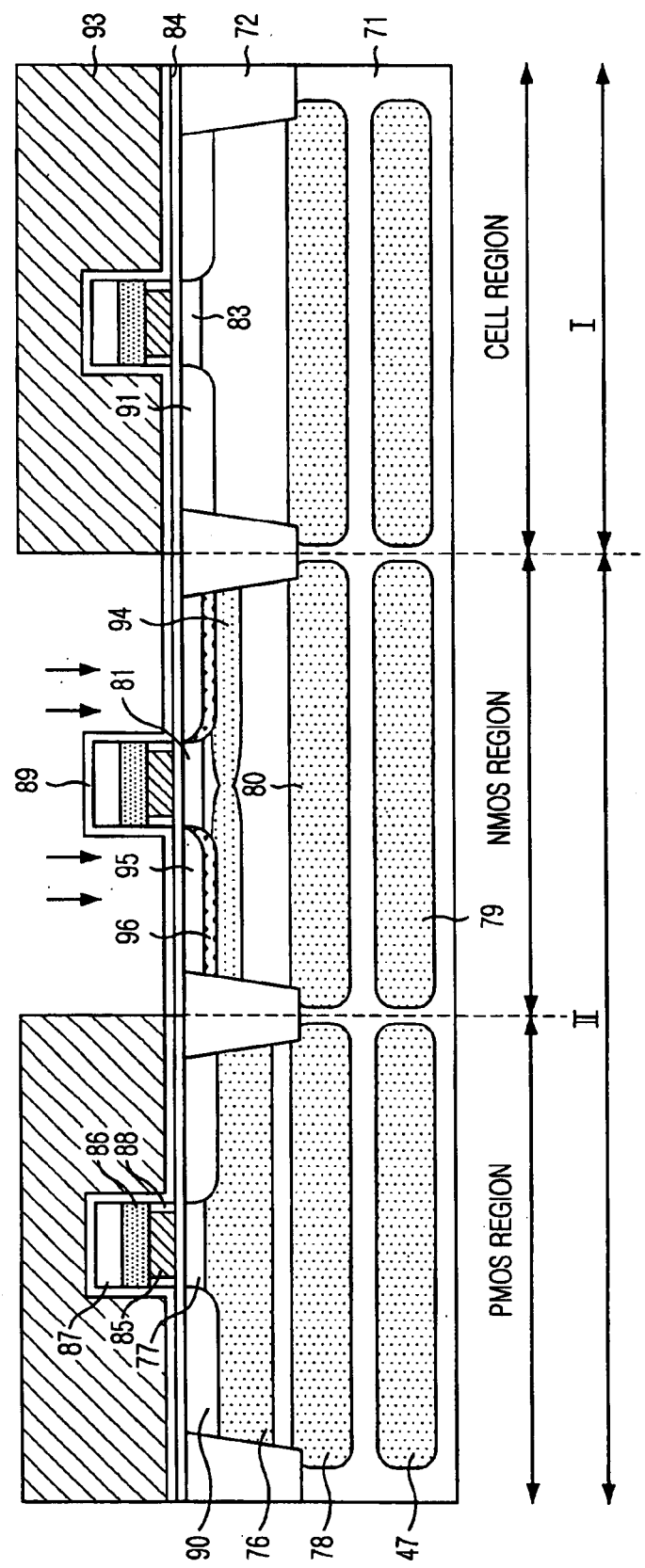

Referring to FIG. 6F, an n⁺ source/drain extension region 95 is formed by ion-implanting a high concentration arsenic (AS) without eliminating the fourth mask 93. A second LDD region 96 is formed by ion-implanting phosphorus (P).

A depth of the second LDD region 96 is same or shallower than the first LDD region 92 and deeper than the n⁺ source/drain extension region 95. An impurity concentration of the first and second LDD regions 92 and 96 are low.

Since the first LDD region 92 and the second LDD 96 are identical, an explanation of the first LDD region 92 is omitted here and an explanation of the second LDD are 96 is in below.

Finally, the second LDD region 96 has a configuration surrounding the n+ source/drain extension region 95.

In a meantime, the phosphorus is ion-implanted with an implantation angle of 90° or a low angle of inclination from 0° to 15° in bi-directions or multiple implantation directions for forming the second LDD region 96.

Figure 6G:
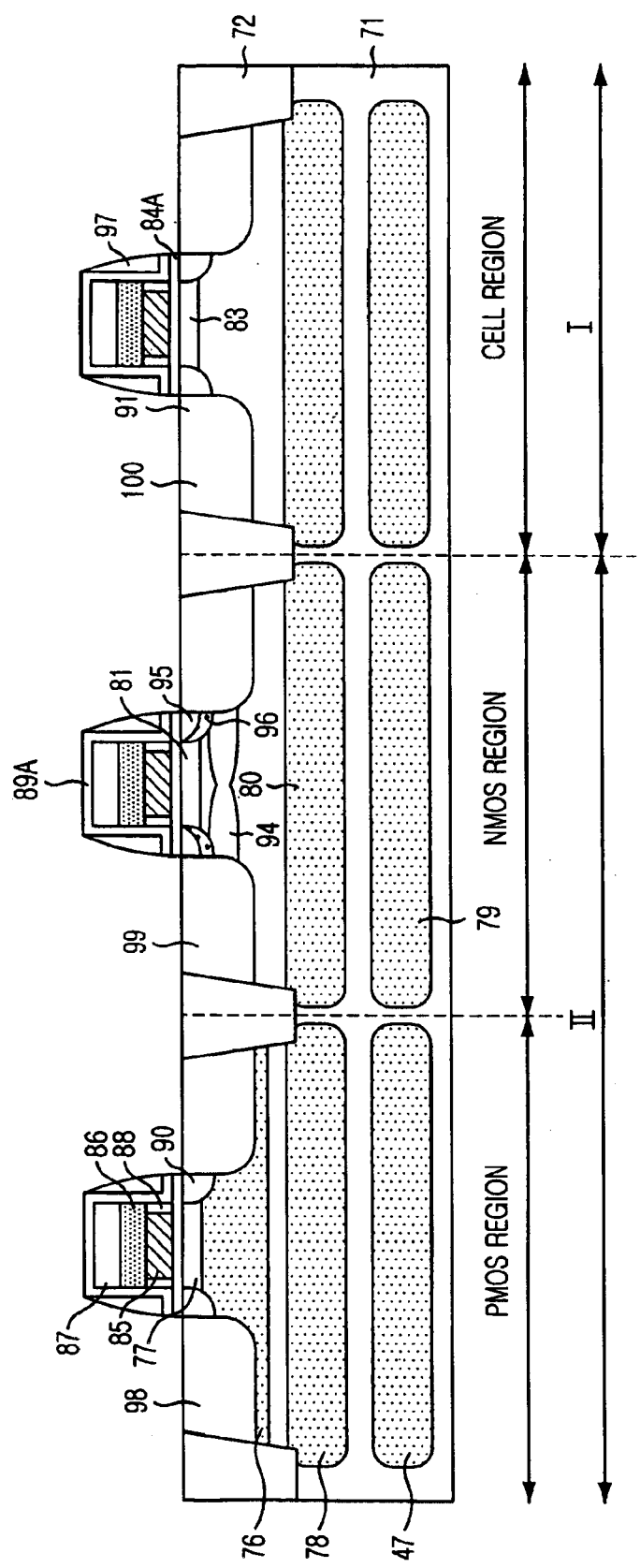

Referring to FIG. 6G, after eliminating the fourth mask 93, an oxide layer is deposited on an entire surface of the above structure. An oxide spacer 97 is formed by performing an etch-back process to the entire surface or performing the etch-back process with use of a mask covering the cell region. At this time, a nitride layer and gate oxide layer are concurrently etched and remained as a nitride layer spacer 89A and a gate oxide layer 84A.

Next, a source/drain region is formed by using another masks on each of the transistor regions. For example, a p+ source/drain region 98 is formed by ion-implanting a high concentration of the p-type impurity and an n+ source/drain region 99 is formed on the nMOS region by ion-implanting a high concentration of the n-type impurity.

In a meantime, an automatic doping method is used for forming an n+ source/drain region 100 since the n+ source/drain region 100 of the cell transistor has a refresh problem when mass amounts of ions are implemented. The automatic doping method uses a heat extension from a doped poly-silicon plug or doped epi-silicon plug.

The method, as mentioned above, can fabricate a buried channel pMOS transistor having a duplicate punch stop layer structure containing a first n-type punch stop layer 46 and 76 formed by heavy ion implantation and a second punch stop layer 58 and 90 for ion-implanting the phosphorous. The duplicate punch stop layer structure prevents a short channel effect of the pMOS transistor and it makes possible to produce a pMOS transistor having a gate 100 nm gate length.

Therefore, the present invention can produce a short channel CMOS transistor with low expense.

Also, the nMOS transistor of the peripheral circuit unit II has independent LDD structure since the second LDD region is separately formed after the first LDD region is formed by ion-implanting the phosphorous. Therefore, the nMOS transistor can be controlled independently.

Furthermore, the hot carrier problem of the nMOS transistor can be constrained since the nMOS transistor of the peripheral circuit unit has the second LDD region doped by the phosphorous surrounding the n⁺ source/drain region doped by the arsenic.

In a meantime, a short channel characteristic of the nMOS transistor having duplicated LDD region and the source/drain extension region can be degraded by side extension of the phosphorous comparing to a nMOS transistor having a source/drain extension region, however the side extension is not serious problem since a doping concentration of the duplicated LDD region is comparatively small and it can be sufficiently constrained that junction of the duplicate LDD region is getting deeper, since the p-type punch stop layer is located under the duplicate LDD region. Therefore, degradation caused by the side extension of the phosphorous is not occurred in the present invention.

Moreover, the junction depth of the duplicate LDD region can be implemented as 20 nm in case of low energy ion implantation by using a screen layer of thin oxide layer and nitride layer. As a result, 70 nm nMOS and 70 nm cell transistor can be implemented since the junction depth of the duplicate LDD region satisfies a requirement of the 70 nm nMOS and 70 nm cell transistor.

The present invention can be used for fabricating a CMOS device having a triple well structure, a CMOS device for a semiconductor substrate having a buried doping layer in order to prevent latch-up, a CMOS device implemented on an wafer grown epitaxially having a buried doping layer in order to prevent latch-up and a CMOS device for SOI circuit board.

The present invention can fabricate a CMOS transistor with low expense and simple processes. It also control independently a characteristic of nMOS and pMOS since implementation of the duplicate punch stop layers.

Also, by the present invention, a CMOS transistor with surface channel nMOS having 70 nm gate and a buried channel pMOS having 0.1 μm gate with fewer making processes.

Furthermore, the present invention provides a method that produces a LDD region can constrain degradation caused by a hot carrier effect of the nMOS since low concentration doped LDD region surrounds the high concentration doped source/drain extension region.

Moreover, the present invention provides a method for producing a CMOS transistor having enhanced performance since a short channel characteristic and operation power can be controlled by the duplicate punch stop layer of the pMOS region and the operation power of the nMOS is also controlled by dopant concentration of the duplicated LDD region combined by the first LDD region and the second LDD region.

While the present invention has been described with respect to certain preferred embodiments, it will be apparent to those skilled in the art that various changes and modifications may be made without departing from the scope of the invention as defined in the following claims.

What is claimed is:

1. A semiconductor, comprising
    a gate electrode and a gate oxide layer on a semiconductor substrate;
    spacers formed on sides of the layer;
    a first conductive type source/drain region formed at edge of the spacers in the semiconductor substrate;
    a second conductive type punch stop layer formed in a region between the first conductive type source/drain region in the semiconductor substrate;
    a first conductive type source/drain extension region occupying a extended region from the first conductive type source/drain region to the both edges of the gate electrode; and
    a first conductive type lightly doped drain (LDD) region being adjoined to the source/drain region and surrounding the source/drain extension region, wherein the junction depth of the first conductive type LDD region is constrained by the punch stop layer.

2. The semiconductor as recited in claim 1, wherein the first conductive type LDD region has lower impurity concentration comparing to the first conductive type source/drain region and the first conductive type source/drain extension region.

3. The semiconductor as recited in claim 1, the thickness of the first conductive type source/drain extension region is thinner than the first conductive type source/drain region and the depth of the first conductive type LDD region is deeper than the first conductive type source/drain extension region and shallow than the source/drain region.

4. The semiconductor as recited in claim 1, the first conductive type LDD region has at least duplicate structure that surrounds the first conductive type source/drain extension region.

5. The semiconductor as recited in claim 1, further comprising:
   a second conductive type field stop layer, which is deeper than the second conductive type punch stop layer; and
   a second conductive type well region, which is deeper than the first conductive type field stop layer.

6. The semiconductor as recited in claim 1, wherein the first conductive type source/drain extension region and the first conductive type LDD region are an conductive type impurity doping layer having different extension rate and the extension rate of the impurity in the first conductive type LDD region is faster.

7. The semiconductor as recited in claim 6, wherein arsenic is implanted to the first conductive type source/drain extension region and phosphorous is implanted to the first conductive type LDD region.

8. A semiconductor device, comprising:
   a semiconductor substrate having a nMOS region and a pMOS region;
   a gate electrode and a gate oxide layer formed on each of the nMOS region and the pMOS region;
   spacers contacted to sides of the layer;
   a p-type source/drain region formed in the pMOS region by lining up at edges of the spacers;
   a n-type source/drain region formed in the nMOS region by lining up at edges of the spacers;
   a first punch stop layer formed by overlapped on bottom of the p-type source/drain region;
   a second punch stop layer formed by contacting to one side of the p-type source/drain region and on the bottom of the spacers;
   a third punch stop layer formed by contacting to one side of the n-type source/drain region;
   a source/drain extension region formed by contacting to one side of the n-type source/drain region and on bottom of the spacers; and
   a lightly doped drain (LDD) region surrounding the source/drain extension region.

9. The semiconductor as recited in claim 8, wherein the LDD region has a multiple layer structure by a number of times doped with identical impurity.

10. The semiconductor as recited in claim 8, wherein the source/drain extension region and the LDD region are an conductive type impurity doping layer having different extension rate and the extension rate of the impurity in the first conductive type LDD region is faster.

11. The semiconductor as recited in claim 10, wherein the source/drain region is a doping layer of arsenic and the LDD region is a doping layer of phosphorous.

12. The semiconductor as recited in claim 8, wherein an impurity concentration of the LDD region is in low comparing to the n-type source/drain region and the source/drain extension region.

13. The semiconductor as recited in claim 8, wherein the first punch stop layer is a doping layer of an arsenic and the second punch stop layer is a doping layer of phosphorous.

* * * * *